United States Patent [19]
Mikkelsen, Jr. et al.

[11] Patent Number: 5,196,652
[45] Date of Patent: Mar. 23, 1993

[54] WIRELESS ELECTRICAL CONNECTIONS OF ABUTTING TILED ARRAYS

[75] Inventors: James C. Mikkelsen, Jr., Los Altos; William Meuli, Sunnyvale; Richard Bruce, Los Altos; Jackson Ho, Palo Alto, all of Calif.

[73] Assignee: Xerox Corporation, Stamford, Conn.

[21] Appl. No.: 633,923

[22] Filed: Dec. 26, 1990

[51] Int. Cl.$^5$ .............................................. H05K 1/00
[52] U.S. Cl. .................... 174/250; 174/254; 29/843
[58] Field of Search ................. 174/250, 254, 255, 261, 174/262, 263, 264, 266; 29/830, 843, 844

[56] References Cited

U.S. PATENT DOCUMENTS

| | | | |
|---|---|---|---|
| 2,756,485 | 7/1956 | Abramson et al. | 29/830 |
| 3,201,851 | 8/1965 | Stearns | 174/262 X |
| 3,971,610 | 7/1976 | Buchoff et al. | 174/264 X |
| 4,191,789 | 3/1980 | Brown | 174/262 X |
| 4,289,846 | 9/1981 | Parks et al. | 427/96 X |
| 4,628,406 | 12/1986 | Smith et al. | 361/414 X |
| 4,633,035 | 12/1986 | McMonagle | 428/901 X |
| 4,712,161 | 12/1987 | Pryor et al. | 29/846 X |
| 4,787,853 | 11/1989 | Igarashi | 174/262 X |

FOREIGN PATENT DOCUMENTS

| | | | |
|---|---|---|---|
| 1052475 | 4/1979 | Canada | 174/263 |
| 1-133397 | 5/1989 | Japan | 174/255 |
| 1-145890 | 6/1989 | Japan | 174/255 |
| 1220370 | 1/1971 | United Kingdom | 174/262 |

*Primary Examiner*—Leo P. Picard
*Assistant Examiner*—Trinidad Korka
*Attorney, Agent, or Firm*—Anglin & Giaccherini

[57] ABSTRACT

A method for electrically connecting planar element substrates (12) to form an array (10) by forming conductive bridges (16) between metal pads (14) located on the surface of array elements (12). These bridges (16) are designed to transmit or receive visual, acoustical or other electromagnetic data and power. The conductive bridges (16) are formed to be nearly coplanar with the planar elements (12) and are made to connect the edges (14b) of pads (14) which are fused to the planar substrate (12). Metal wire (16a), solder (16b-c), a conductive polymer (16d), or a suspension of conductive particles in paste (16e) are used to bridge and electrically connect the pads (14) located on the array elements (12). The bridges (16) have a low profile, occupy a very small area and reduce the need for highly accurate alignment of adjacent substrates (12) within the tiled array (10) before electrical connections are formed. These low profile bridges (16) are especially advantageous in that they allow a protective plastic or similar cover sheet, or a liquid crystal laminate to be surface mounted on the composite array (10) without causing detrimental surface blemishes or ridges. The small area of the bridges (16) greatly reduces the non-transmitting area of the visual display. The bridges (16), being substantially narrower than the pads (14) which they connect, are more likely to connect the intended pads (14) and less likely to "short" pads (14) which are not in accurate alignment.

12 Claims, 1 Drawing Sheet

WIRELESS ELECTRICAL CONNECTIONS OF ABUTTING TILED ARRAYS

BACKGROUND OF THE INVENTION

The present invention is a method and apparatus for providing electrical connections. More particularly, this invention relates to the wireless connection between the butting edges of adjacent planar tiles in a multi-tiled visual display system.

Flat screen visual displays, because of their small volume and relative light weight, are of great interest in the computer and television industries. Some uses for flat screen displays include portable computer displays, high definition (HDTV) and conventional television screens and wall mounted visual displays.

Many large flat screen displays are assembled from a series of smaller displays which are linked together electrically and mechanically. There are several reasons why large displays are manufactured in this manner; many manufacturers do not have the capability to produce large flat displays as single units, and the yield of good displays is often low. Low yields mean that it is more economically attractive to piece together a large display from selected good smaller panels than to risk losing a large and costly panel during production.

One conventional method of connecting visual display panels employs discrete wire bonding between adjacent panels. The present invention will replace these wire bonds with a wireless connection employing one of several conductive media.

The quality of a large visual imaging system built of smaller displays depends, to some extent, on the percentage of usable display area. The area of each display devoted to an interconnection between itself and the adjoining display is unusable as a visual display. Conventional wire bonds occupy a relatively large area of the visual displays; the connection area is unusable as a visual transmitter. An objective of wireless interconnections, along with electrical integrity, is to minimize the visual display area they occupy and maximize the area available for visual output.

Flat screen visual displays are often protected from mechanical damage by a transparent cover. This cover may integrate a liquid crystal or other display system. The cover ideally lies directly on the screen elements. If the screen is a composite of smaller elements, however, and conventional wire bonding is used to connect abutting elements, the wires may create bumps or ridges under the cover. Thus, conventional wire bonds could prevent the cover from adhering smoothly to the panel faces and cause disturbing visual distortions. It is a further aim, therefore, of the present invention to maintain an inter-panel connection which is nearly planar with the adjacent panels it connects. This allows a protective cover or display cover to lie flush and smooth over the display tiles which make up the array.

The problem of providing small area, low volume interconnections has presented a major challenge to designers of flat display panels. The development of a reliable connection, occupying a small area between adjacent panels, would represent a major technological advance in flat panel output performance. The enhanced performance which could be expected using such interconnections would satisfy a long felt need in the field of flat display devices.

SUMMARY OF THE INVENTION

Electrical butting of tiled arrays by wireless bonds is a method and apparatus which solves the problem of devoting a distractingly large area of tiled visual displays to interconnections. The present invention further solves the problem of interconnections between visual displays interfering with a display cover's or protective cover's ability to lie flush on the displays. When edges of flat display panels must be electrically connected, this system utilizes a smaller area of the visual panel to form the joint than other available methods. Therefore, the usable area for visual display is at a maximum. Additionally, the current wireless connection method maintains near coplanarity between the display panels and the electrical connections, allowing a protective or display cover sheet to lie smoothly on the panel faces. The invention solves two problems inherent in wire bonding between flat panel displays: the problem of devoting too great an area to connections, and the problem of preventing a liquid crystal laminate or cover sheet from lying flat over the panels.

The present wireless electrical connecting method applies to an array of flat electronic devices which must be linked electrically to each other. Particularly, the electronic devices are part of a flat visual display screen. The invention connects leads, or metal pads, which are located around the periphery of individual tiled elements of the array with leads in adjacent tiled elements in the composite array. These connections are made using small conductive bridges as opposed to discrete wires. Conductive bridges have several major advantages over discrete wires in this application; the bridges have a low profile and therefore do not create bumps under a liquid crystal laminate or cover sheet which may be laid over the array of tiles; wireless connections occupy a smaller surface area of the overall tiled array than do discrete wire bonds and therefore leave a greater area free to transmit visual or other signals. These wireless electrical connections are a significant improvement over discrete wire bonding.

An appreciation of other aims and objectives of the present invention and a more complete and comprehensive understanding of this invention may be achieved by studying the following description of a preferred embodiment and by referring to the accompanying drawings.

DETAILED DESCRIPTION OF A PREFERRED EMBODIMENT

Figure 1:
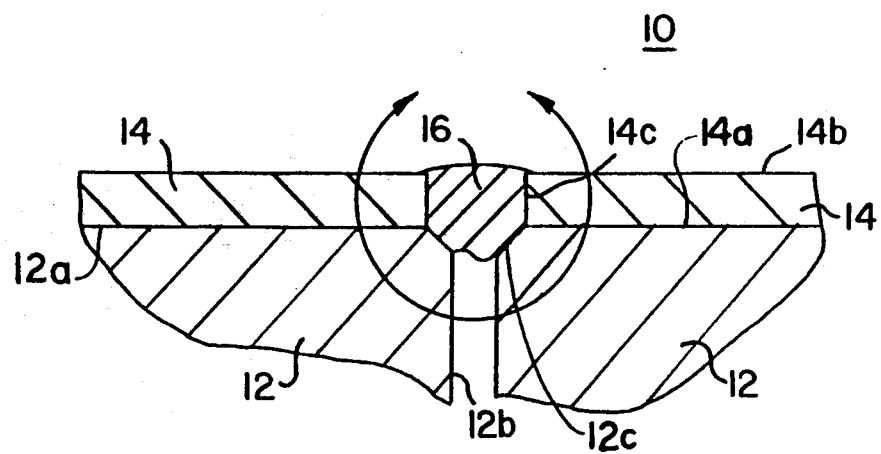
FIG. 1 is a cross sectional view of two substrates, two metal pads and a conductive bridge.

FIG. 1 is a cross-sectional view of a tiled array 10 of visual displays. The substrate 12 is a dielectric material, such as glass or polyimide, and provides a support base for the metal pads 14 whose first face 14a is attached to the substrate face 12a. Both the lower pad face 14a and the substrate face 12a lie perpendicular to the plane of the paper in FIG. 1. The metal pads 14 used in the preferred embodiment may be aluminum, copper, gold, nickel, or any material which is capable of conducting electrical signals or power. The metal pads 14 may be affixed to the substrate base 12 by one of several means, which include, but are not limited to: electroless plating, electro-plating, chemical vapor deposition or physical deposition. The pad edge 14c terminates at or near the substrate bevel 12c. In the preferred embodiment, the bevel angle is approximately between 25 and 75 degrees. The distance between pairs of pad edges 14c to be joined is about one thousandth of an inch. A conductive bridge 16 carries electrical signals and powder between the metal pads 14.

Figure 2:
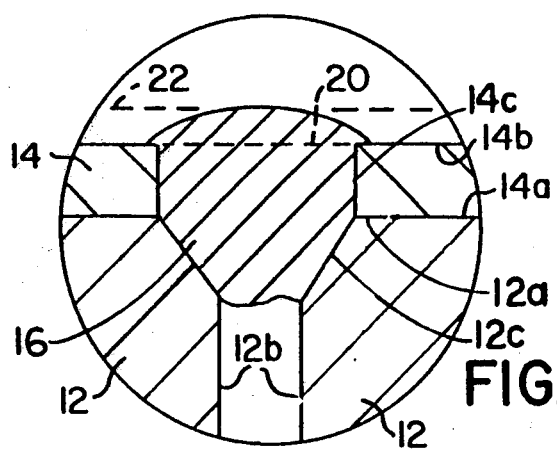
FIG. 2 is an exploded cross section of a conductive bridge as it connects adjacent metal pads. A plane containing a support face and a conductive bridge maximum height surface are shown.

FIG. 2 is an exploded cross-sectional view showing the conductive bridge 16. Conductive bridges 16 carry power and signals between the various pads 14 located on substrates 12 which comprise the tiled array 10. A plane 20 is generally defined by the upper pad faces 14b of the metal pads 14, attached to the substrates 12, which comprise the tiled array 10. The plane 20 is a reference plane for the preferred contact surface between the tiled array 10 and a protective plastic cover sheet or a liquid crystal laminate which may be attached to the array 10. The plane 20 may pass through the conductive bridges 16 since the bridges possibly extend to both sides of the plane 20, representing the preferred contact surface between the tiled array 10 and a cover sheet of plastic or liquid crystal laminate. Additionally, a conductive bridge maximum height surface 22 references the distance above the plane 20 which the conductive bridge 16 may generally extend in the preferred embodiment. In the preferred embodiment, the conductive bridge maximum height surface 22 is usually within about six microns of the ideal contact plane 20. In the preferred embodiment, this height limitation applies only to the portion of conductive bridge which is not contained within the tiles of the composite array 10. The conductive bridge 16 is connected to the pad edge 14c and may be connected to the upper pad face 14b. The bridge 16 also may extend to touch the substrate bevel 12c and the substrate edge 12b.

Figure 3:
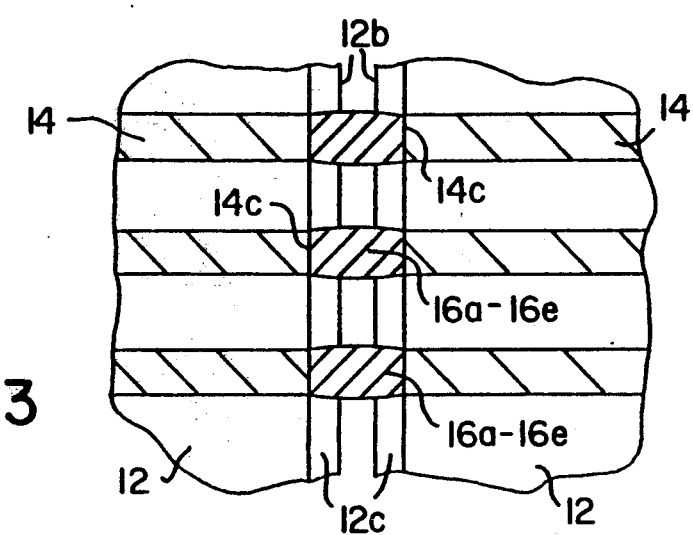
FIG. 3 is a plan view of two substrates, three pairs of metal pads and three conductive bridges. The conductive bridges are schematic representations of one or more of the following techniques: bonded conductive balls, which may be gold or any other electrically conductive material; melted solder joints which have been applied in a pattern; melted solder joints in which the solder has been applied over a broad area and selectively melted; an organic conductive compound; a suspension of conductive particles comprising conductive polymers or epoxy material, or conductive spheres, flakes of powder in structural media. These methods of electrically bridging metal pads, though not exhaustive, are functionally interchangeable.

FIG. 3 is a plan view of two substrates 12, six metal pads 14, and three conductive bridges 16 which comprise a tiled array 10. The two substrates 12 are arranged side-by-side and are joined by the conductive bridges 16. The pitch of the metal pads is 50–1000 pads per inch. FIG. 3 is a schematic drawing which includes a generic representation of the various conductive bridges 16a–16e employed by the preferred embodiment. These bridges, 16a, b, c, d, and e, are all functionally interchangeable and are all equally satisfactory for the performance of this invention. The conductive bridges 16 in FIG. 3 may be formed using a conductive ball bond 16a. The conductive ball bond 16a is formed of gold or other conductive wire about 1.0 or 0.5 thousandth of an inch in diameter. More than one conductive ball bond 16a may be used to connect a pair of metal pads 14. The resulting conductive ball bonds 16a may be either melted or mechanically compressed as necessary to regulate the conductive bridge maximum height surface 22. An ultrasonic bonder could be employed to apply the conductive ball bonds 16a. The view shown is a broken away section of a tiled array 10 which may extend in any direction parallel to the plane of the paper in FIG. 3.

FIG. 3 also represents a functionally similar embodiment of the invention in which the conductive bridges 16b are formed from solder. The solder may be any alloy with a low melting point and high conductivity, but the preferred embodiment uses one of the commercially available lead-tin alloys. A flux, either integral to the solder form, or applied separately, is used to clean the surfaces which will be joined. When fabricating a conductive bridge 16b, solder and a flux are applied in a pattern so that when the tiled array 10 is generally heated, the solder will melt to form conductive bridges 16b. The solder pattern can be achieved through a variety of techniques. Some methods of applying solder in a pattern include: printing directly onto the metal pads 14, either using a transfer tape fabricated by screen printing or lithographic patterning, or using a lift-off technique to define solder areas, or, alternatively, by employing a spacer to contain the solder and by preventing it from bridging between unintended pairs of metal pads 14. By applying many thin solder stripes across the gaps between pairs of metal pads 14 in the tiled array 10, the risk of electrically connecting pairs of metal pads 14 other than those intended, and the need for highly accurate alignment of those pairs can be significantly reduced.

FIG. 3 further represents another functionally similar embodiment of the invention, employing conductive bridges 16c. The solder which forms the conductive bridges 16c, however, is applied in a different manner from that in bridges 16b. Solder and a flux used to form bridges 16c are applied over and around the areas where conductive bridges 16c are desired. Then, the solder is melted only in those areas where conductive bridges 16c are needed. A laser or hot jet of air may be used to melt the solder where desired. Again, by melting only narrow stripes of solder at a time, the need for extremely accurate alignment between pairs of metal pads 14 may be reduced. Finally, any excess solder and flux are removed, and the conductive bridges 16c are all that remain.

FIG. 3 additionally represents the use of the following, functionally similar, yet physically different conductive bridges, here labeled 16d. The conductive bridges 16d are of a conductive organic paste. The conductive paste may be a polymer. It also may be a thermally curable or other epoxy. Dots of the conductive organic paste forming conductive bridges 16d may be about 4.0 thousandths of an inch in diameter, and positioned within about 0.5 thousandths of an inch.

FIG. 3 also represents conductive bridges 16e, which may appear similar to those labeled 16d except that the paste which forms each conductive bridge 16e is not itself the conductive media. The paste may be a polymer, epoxy or any material capable of forming a structural bridge. Electricity, however, is transmitted through a suspension of conductive particles in the paste. The structural paste and conductive particles together form the conductive bridges 16e. These conductive particles may be a conductive polymer or epoxy material or conductive spheres, flakes or powder. The various conductive bridges 16a–16e represented in FIG. 3, though sometimes different from each other in physical appearance, are all interchangeable without affecting the function of this invention. The schematic representation of the conductive bridges 16a–16e in FIG. 3 demonstrates only their physical relationship to the other components of this invention, and does not limit the many variations that may be utilized to practice the present invention.

Although the present invention has been described in detail with reference to a particular preferred embodiment, persons possessing ordinary skill in the art to which this invention pertains will appreciate that various modifications and enhancements may be made without departing from the spirit and scope of the claims that follow.

LIST OF REFERENCE NUMERALS

FIG. 1

10: Tiled array
12: Substrate
12a: Substrate face
12b: Substrate edge
12c: Substrate bevel
14: Metal pad
14a: Lower pad face
14b: Upper pad face
14c: Pad edge
16: Conductive bridge

FIG. 2

20: Reference plane
22: Conductive bridge maximum height surface

FIG. 3

16a: Conductive ball bond
16b: Selectively applied solder paste
16c: Generally applied solder paste
16d: Conductive organic paste
16e: Conductive particles suspended in paste

What is claimed is:

1. An apparatus comprising:
   (a) a plurality of adjacent dielectric means (12) for providing support; each one of said dielectric means (12) having a substrate face (12a), and a substrate edge (12b);
   (b) a pair of conductive means (14) for transmitting electricity; said conductive means (14) each having a pad edge (14c), a lower pad face (14a) and an upper pad face (14b); said upper pad face (14b) defining a reference plane (20); said lower pad face (14a) of each one of said pair of conductive means (14) being coupled to said substrate face (12a) of each one of said plurality of adjacent dielectric means (12); and
   (c) a conductive bridging means (16) for transmitting electricity; said conductive bridging means (16) located between said pad edges (14c) of said conductive means (14); said conductive bridging means (16) connected to said conductive means (14).

2. An apparatus as claimed in claim 1, in which said conductive means (14) is a metal pad.

3. An apparatus as claimed in claim 1, in which each one of said plurality of adjacent dielectric means (12) has a substrate bevel (12c).

4. An apparatus as claimed in claim 1, in which said apparatus comprises a plurality of pairs of conductive means (14) for transmitting electricity.

5. An apparatus as claimed in claim 2, in which said conductive bridging means (16) comprises:
   (a) a conductive bridge maximum height surface (22); said conductive bridge maximum height surface (22) being further from said lower pad face (14a) than from said upper pad face (14b); said conductive bridge maximum height surface (22) being a furthest surface from said plane (20); said conductive bridge maximum height surface being within about six microns from said plane (20).

6. An apparatus as claimed in claim 5, in which said conductive bridging means (16) is a pattern of paste (16b) which has been applied selectively between said 7. An apparatus as claimed in claim 5, in which said conductive bridging means (16) is a pattern of paste (16b) which has been applied selectively between said conductive means (14); said selectively applied pattern of solder paste (16b) is then melted to form said conductive bridge (16).

8. An apparatus as claimed in claim 5, in which said conductive bridging means (16) is a generally applied solder paste (16c) which is then selectively melted between said conductive means (14) to form said conductive bridge (16).

9. An apparatus as claimed in claim 5, in which said conductive bridging means (16) is a conductive organic paste (16d).

10. An apparatus as claimed in claim 5, in which said conductive bridging means (16) is a suspension of conductive particles in a paste (16e).

11. An abutted array system comprising:
   (a) a plurality of substrates (12) having a substrate face (12a), a substrate edge (12b) and a substrate bevel (12c);
   (b) a plurality of metal pads (14) having a pad edge (14c), a lower pad face (14a), and an upper pad face (14c); said upper pad face (14c) defining a reference plane (20); said lower pad face (14c) coupled to said substrate face (12a) of said substrate (12) and said pad edge (14c) terminating approximately at said substrate bevel (12c);
   (c) a conductive bridge (16) connected to said metal pads (14); said conductive bridge (16) including;
   (d) a conductive bridge maximum height surface (22); said conductive bridge maximum height surface (22) located further from said lower pad face (14a) than it is from said upper pad face (14b); said conductive bridge maximum height surface being within about six microns from said plane (20); said conductive bridge maximum height surface (22) being a furthest surface from said plane (20).

12. A method of fabricating a plurality of electrical connections between a plurality of composite arrays of electrical devices, comprising the steps of:
   (a) affixing a plurality of electrical devices (14) to a plurality of carrier substrates (12) in a tiled array (10);
   (b) extending said conductive devices (14) about an edge (12b) of said substrates (12); and
   (c) interconnecting said conductive devices (14) in said tiled array (10) with a conductive bridge (16).

* * * * *